United States Patent

Gundersen

[15] 3,656,152

[45] Apr. 11, 1972

[54] IMPROVED A-D/D-A CONVERTER SYSTEM

[72] Inventor: James L. Gundersen, Carson, Calif.

[73] Assignee: Hughes Aircraft Company, Culver City, Calif.

[22] Filed: Feb. 16, 1970

[21] Appl. No.: 11,499

[52] U.S. Cl. ..................................340/347 AD, 340/347 DA

[51] Int. Cl. ..........................................................H03k 13/02

[58] Field of Search..................................340/347; 235/154; 328/162–164; 324/118; 307/235

[56] References Cited

UNITED STATES PATENTS 2,974,315 3/1961 Lebel et al. ............................340/347

2,909,676 10/1959 Thomas ............................340/347 X

OTHER PUBLICATIONS

Hoeschele, Jr.; David F. Analog-to-Digital/Digital-to-Analog Conversion Techniques, 1968, page 159 published by John Wiley & Sons, Inc., New York

*Primary Examiner*—Maynard R. Wilbur

*Assistant Examiner*—Charles D. Miller

*Attorney*—James K. Haskell and Bernard P. Drachlis

[57] ABSTRACT

A system for transmitting digital representations of analog signals which increases resolution without a corresponding increase in the number of bits in the digital data which is transmitted. In one embodiment, the analog input signal is applied to a level change circuit and summed with a square wave having peak-to-peak voltage equal to one-half the magnitude of the value of the least significant bit of the digital representation. The square wave pattern output of the level change circuit is applied to an analog-to-digital converter and the digital output is transmitted to a digital-to-analog converter. The output of the digital-to-analog converter is filtered to provide the analog output signal. During the time that the square wave pattern crosses an analog-to-digital converter threshold value, the resultant digital-to-analog output is a square wave with an average value between the normal discrete analog output levels. This results in twice as many levels at the analog output which is equivalent to the addition of one bit of resolution.

11 Claims, 13 Drawing Figures

INVENTOR.
JAMES L. GUNDERSEN,

Bernard P. Drachlis
ATTORNEY.

IMPROVED A-D/D-A CONVERTER SYSTEM

BACKGROUND OF THE INVENTION

This invention relates to an analog-to-digital-to-analog conversion process of a data transmission system and more particularly to means of increasing the resolution of such a system.

In the prior art systems, an analog input signal is applied to an analog-to-digital (A-D) converter and converted to a digital word of n bits, where n is an integer. The n bit digital word is sent to a digital-to-analog (D-A) converter which provides an analog output which approximates the analog input signal with a quantized representation of the analog input signal. The resolution of this prior art circuit is $½^n$ times full scale voltage of the A-D converter.

One technique that has been used in the past to increase resolution is to add more bits to the analog-to-digital-to-analog process. While this method is very straightforward, in some systems it can be extremely disadvantageous due to the extra bit line required in a parallel transmission system or the extra bits required in a serial transmission system to transmit the extra bit of information. Another method used has been to add pseudo random noise to the analog-to-digital converter and then subtract the noise at the digital-to-analog converter. This method has been used in PCM television transmission systems to improve performance.

SUMMARY OF THE INVENTION

This invention provides means for increasing the resolution of the analog-to-digital-to-analog conversion process of a data transmission system without increasing the number of bits of data transmitted and only slightly increasing the complexity of the analog-to-digital conversion system. This is accomplished in one embodiment by superimposing a square wave having peak-to-peak voltage equal to one-half the magnitude of the value of the least significant bit onto the analog input. During the time that the square wave pattern crosses an analog-to-digital converter threshold level, the resultant digital-to-analog converter output is a square wave with an average value between the normal discrete analog output levels. This results in twice as many levels at the analog output which is equivalent to the addition of one bit of resolution. The present invention improves the prior art system to provide resolution of $½^{n+1}$ times full scale voltage without adding an additional bit to the digital word which is transmitted between the A-D converter and the D-A converter.

DESCRIPTION OF THE DRAWINGS

The novel features and advantages of the invention will become more apparent from the following detailed description when taken in conjunction with the accompanying drawings in which.

DESCRIPTION OF THE PREFERRED EMBODIMENTS

Figure 1:
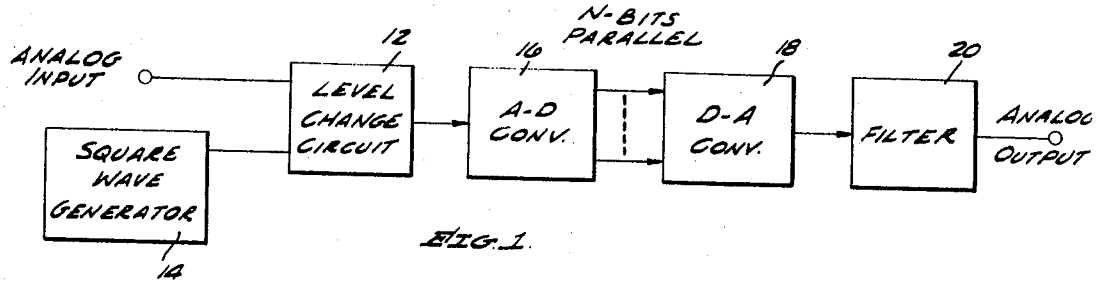
FIG. 1 is a block diagram generally illustrating one embodiment of the invention.
Figure 2:
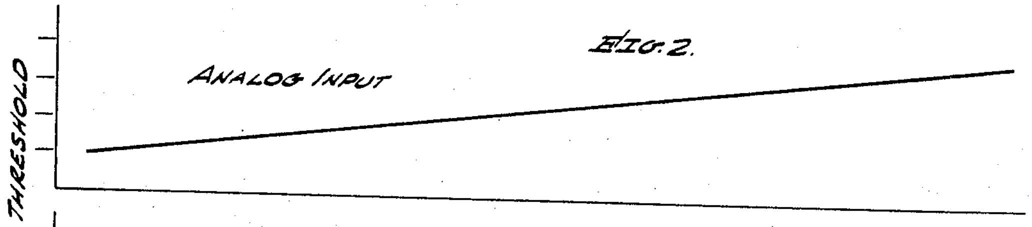
FIGS. 2–6 are waveform diagrams illustrating signals at various points of the system depicted in FIG. 1.
Figure 3:
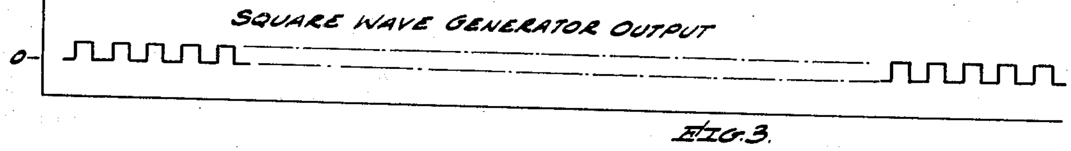
Figure 4:
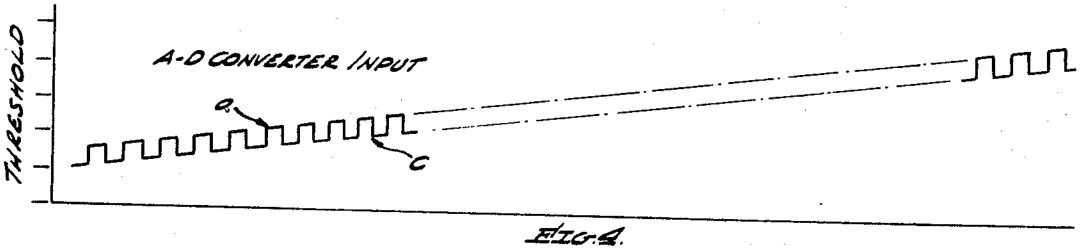

One embodiment of the improved system is shown in FIG. 1. The analog input signal is applied to one input of a level change circuit 12. The details of the level change circuit 12 will be described later with reference to FIG. 7. A typical analog input signal waveform is shown in FIG. 2. The second input to the level change circuit 12 is a square wave which has a peak-to-peak voltage of one-half the voltage represented by the least significant bit position of the digital word, that is, one-half times $½^n$ times full scale voltage. The square wave is shown in FIG. 3. The square wave may be generated in any convenient manner and is shown symbolically as a square wave generator 14 in FIG. 1. For example, the square wave generator 14 may be a free running multivibrator. The level change circuit 12 superimposes the square wave signal onto the analog input signal. The output of the level change circuit 12 is applied to the input of an A-D converter 16 which may be of any convenient conventional type. One type of analog-to-digital converter which may be used with the present invention is described in U. S. Pat. No. 2,784,396 issued Mar. 5, 1957 and titled "High-Speed Electronic Analogue-to-Digital Converter System." The A-D converter input signal is depicted by the waveform of FIG. 4.

The typical type of A-D converter has a sampling period for each conversion, that is, an accurate digital representation of the analog input to the A-D converter will be available only at successive time intervals. If this type of A-D converter is used, the sampling rate of the converter will be synchronized with the frequency of the square wave generator 14 to avoid a step change in the analog input to the A-D converter in the middle of a sampling period.

Figure 5:
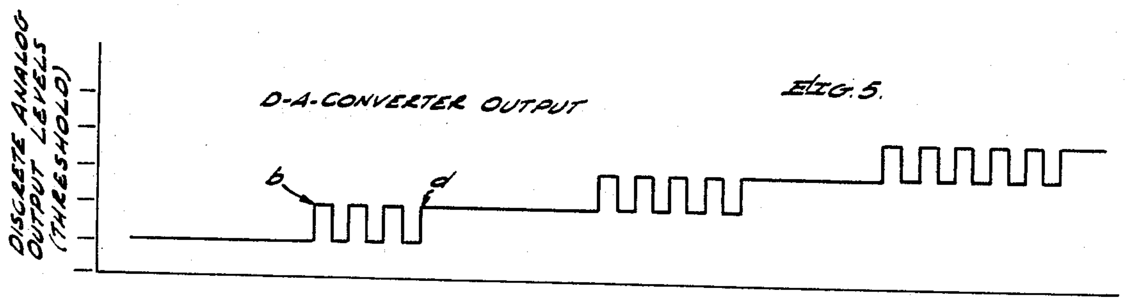
Figure 6:
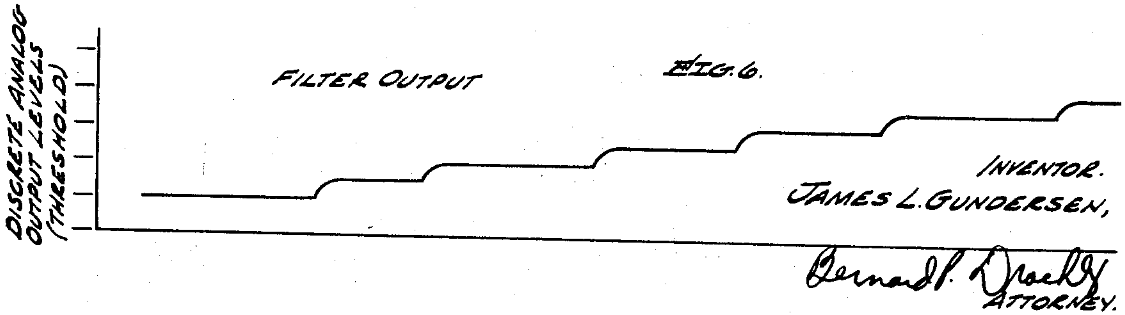

The digital output of the A-D converter 16 is transmitted in parallel to a D-A converter 18 which may be of any convenient conventional type. One type of digital-to-analog converter which may be used with the present invention is described in U. S. Pat. No. 2,718,634 issued Sept. 20, 1955 and titled "Digital-to-Analogue Converter." The digital output of the A-D converter 16 will be transmitted to the D-A converter 18 at least once each time the square wave signal changes state. The output of the D-A converter 18 is shown as the waveform of FIG. 5.

The A-D converter 16 will have threshold levels, also referred to as quantum levels, equal to the equivalent analog voltage of the least significant bit, that is, $½^n$ times full scale voltage. The threshold levels correspond to the analog voltage required to change the digital output by one bit. The threshold levels are shown on the vertical axes of the waveform diagrams of FIGS. 2–6. The square wave input to the A-D converter 16 forces the least significant bit of successive digital words to follow a unique pattern. When the input signal varies between threshold levels, at some point the rising edge of one of the square waves will cross a threshold level, indicated as point a on the waveform of FIG. 4. This will add one bit to the digital representations of the analog signal and will show at the output of the D-A converter 18 as an increased level, indicated as point b on the waveform of FIG. 5. As the falling edge of the square wave signal crosses the threshold, the digital representations of the analog signal will be reduced by one bit and this will produce a square wave signal at the output of the D-A converter 18.

As the square wave signal at the A-D converter input continues to cross the threshold levels, the D-A converter output will continue to be a square wave. At some point the square wave input to the A-D converter will not cross a threshold level, indicated as point *c* on the waveform of FIG. 4. This will make the output of the D-A converter return to a steady DC level, indicated as point d on the waveform of FIG. 5. It should be noted that the frequency of the square wave signal should be chosen in relation to the rate of change of the analog input signal to allow the D-A converter output to have many more square waves than shown between points b and d in FIG. 5 as the A-D converter input crosses the threshold level. This will be explained in more detail later. It should be recalled that the digital representations of the analog input is being transmitted between the A-D converter and the D-A converter at least once each time the square wave input to the A-D converter changes state.

This process will continue and can be described in general as follows: As the input signal varies through a quantum level (between threshold levels), the least significant bit of the digital word will stay constant for one-half of the quantum level. For the other half of the quantum, the least significant bit will alternate between 0 and 1 at the frequency of the square wave signal. The output of the D-A converter 18 is applied to a filter 20 which may be any convenient type of low pass filter. For example, a resistor-capacitor filter will work satisfactorily. The fluctuation of the least significant bit is integrated by the filter 20 to give an effective one-half quantum step in the output signal. The filter output is shown by the waveform in FIG. 6.

Figure 7:
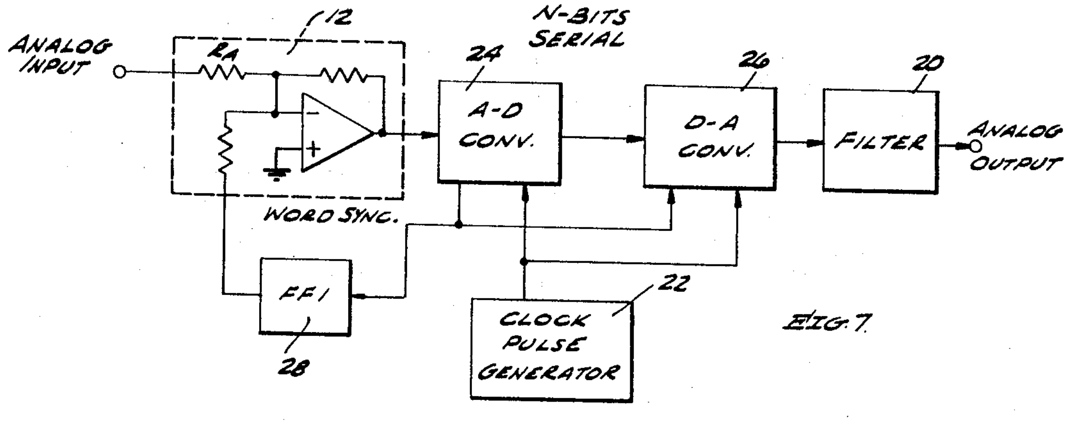
FIG. 7 is a block diagram illustrating a second embodiment of the invention.

FIG. 7 shows a second embodiment of the invention. A clock pulse generator 22 will supply clock pulses for system timing to an A-D converter 24 and to a D-A converter 26. The A-D converter 24 will transmit its digital representations of its analog input signal in serial and the D-A converter 26 will accept the digital representations in serial. With a serial system, there will be a sampling period during which a conversion is being performed. Also, since the digital representations are being transmitted serially, there must be some way to distinguish between the successive digital words being transmitted. A word sync pulse is provided to identify the beginning of a series of bits representing one digital word. The word sync pulse is shown in FIG. 7 as being generated by the A-D converter 24. The word sync pulse controls the operation of the remainder of the system. The word sync pulse could be generated by a separate timing unit (not shown) and applied to the A-D converter 24 to control its timing. The word sync pulse is applied to the D-A converter 26 so that it may properly convert its digital input by being able to identify a series of bits which represent one digital word. The word sync pulse is also applied to a trigger flip-flop 28 labeled FF1 for convenience. The trigger flip-flop 28 will change states each time a word sync pulse is applied to its input. The flip-flop 28 acts as a square wave generator. The output of the flip-flop 28 is applied to the level change circuit which is generally indicated by reference numeral 12 and will be summed with the analog input signal. The details of the level change circuit 12 will be described below. The output of the level change circuit is applied to the A-D converter 24. Because the flip flop 28 is controlled by the word sync pulse of the A-D converter 24, the frequency of the square wave output of the flip flop 28 will be synchronized with the conversion period of the A-D converter 24 and will avoid a step change in the analog input to the A-D converter during a conversion. The A-D converter 24 sends the digital representations of the analog input in a serial manner to the D-A converter 26. The D-A converter will convert the digital representations of the analog input to an analog signal under control of the word sync pulse. The D-A converter 26 output is applied to a filter 20 which may be identical to that used in the system shown in FIG. 1. The filter 20 provides an analog output which is representative of the analog input.

The details of the level change circuit 12 shown in FIG. 7 will now be described. The level change circuit 12 includes an operational amplifier and one additional resistor R. The operational amplifier is shown symbolically as a summing amplifier, a feedback resistor, and an input resistor $R_A$. One type of operational amplifier which may be used is a μA–741 built by Fairchild Semiconductor Division of the Fairchild Camera and Instrument Co., which is more fully described in the engineering data sheet μA–741 at pages 6–133 and 6–134 of the Fairchild Semiconductor Integrated Circuit Data Catalog 1970, Copyright 1969 by Fairchild Semiconductor. The analog input signal to the system is applied to the resistor $R_A$. The square wave output of the flip-flop 28 is applied to the additional resistor R. The relationship between the resistor R and the resistor $R_A$ can be derived by recalling that the desired resolution is one-half the threshold level of the A-D converter which is 1 part in $2^{n+1}$ where n is the number of bits to be transmitted. This requires the current Ip for 1 part in $2^{n+1}$ to be I full scale/$2^{n+1}$. The full scale current, I full scale, will be the full scale (peak-to-peak) voltage of the analog input VA divided by the analog input resistance $R_A$. Also recall that the square wave signal is to add 1 part in $2^{n+1}$. Thus the current added by the flip-flop input is to be Ip, which will be the full scale (peak-to-peak) voltage of the flip-flop output $V_F$ divided by the resistance R. Stated in equation form:

$$Ip = I \text{ full scale}/2^{n+1} = (V_A)/(R_A\,(2^{n+1}))$$

and $$Ip = V_F/R$$

Combining the two equations gives:

$$R = V_F/V_A\,R_A\,(2^{n+1})$$

Thus when the flip-flop 28 is set, a current equal to 1 part in $2^{n+1}$ will be added to the current produced by the analog input signal. Any convenient arrangement of summing amplifier and input resistors may be used as the level change circuit 12.

The frequency of the square wave input to the level change circuit 12 should be chosen in proper relation to the rate of change of the analog input signal. When the rate of change of the analog input signal is low in relation to the square wave frequency, the performance of a system using the techniques of this invention will be adequate to provide increased resolution. However, as the rate of change of the analog input signal increases, the number of fluctuations of the least significant bit are reduced because of the reduced time the analog input signal is within a one-half quantum range. This is particularly true close to the zero crossing of a high amplitude, high frequency sine wave. Therefore, attainment of increased resolution is a function of both frequency and amplitude of the analog input signal.

The principles discussed above can be expanded to increase the resolution of a system even further. Theoretically, the resolution can be increased indefinitely. In practice, there will be a balance between the resolution, the data sample rate, and the frequency and amplitude of the analog input signal to allow for sufficient fluctuations of the least significant bit to provide meaningful data. The resolution of any system can be doubled by adding one flip-flop and one resistor to the level change circuit. For example, the resolution of the system of FIG. 7 can be doubled with the modifications shown in FIG. 8.

Figure 8:
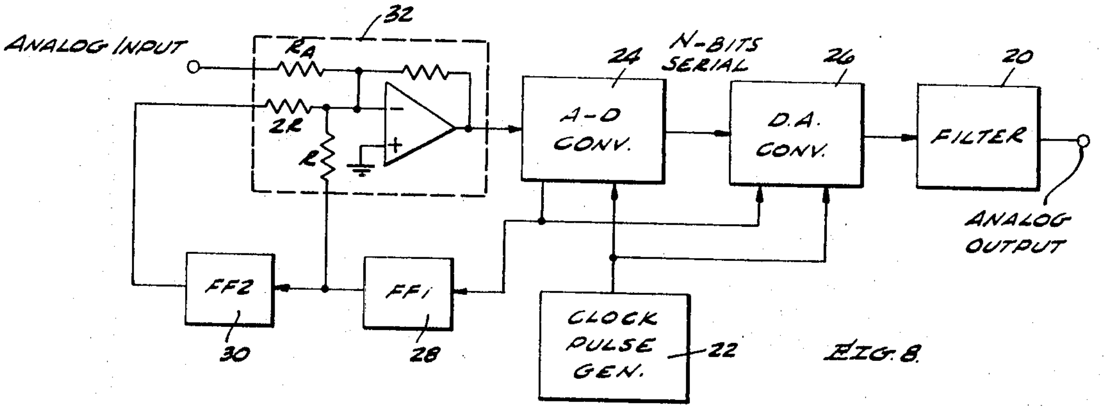
FIG. 8 is a block diagram illustrating a third embodiment of the invention.

FIG. 8 illustrates a system of *n* bits having a resolution of $1/2^{n+2}$. The clock pulse generator 22, and the flip-flop 28 are identical to the same components of the system shown in FIG. 7. The output of the flip-flop 28 is applied to a second flip-flop 30, labelled FF2 for convenience. The flip-flops 28 and 30 operate as a binary counter. A level change circuit 32 will be identical to the level change circuit 12 of FIG. 7 with the addition of a third input resistor 2R which has a resistance of twice that of the resistor R with the value of R determined as explained above. The output of the second flip-flop 30 is applied to the third input resistor 2R.

Figure 9:
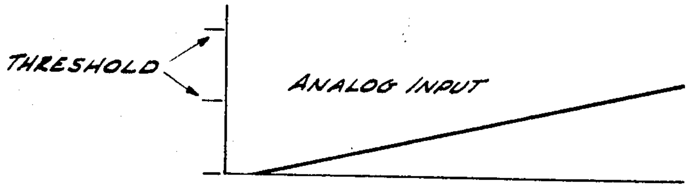
FIGS. 9–13 are waveform diagrams illustrating the operation of the system depicted in FIG. 8.
Figure 10:
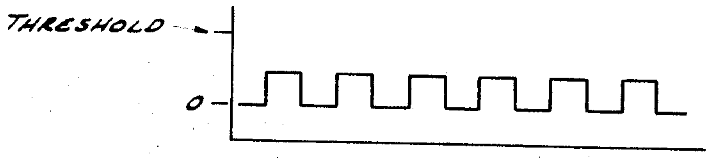
Figure 11:
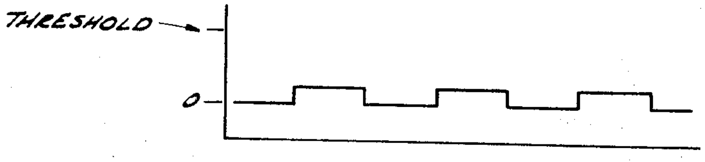
Figure 12:
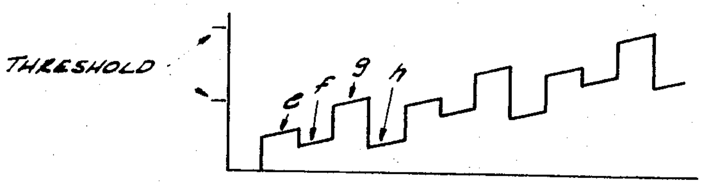

The signal from the flip-flop 28 (FF1) properly scaled by its input resistor R to one-half a quantum level, shown in FIG. 10, and the signal from the second flip-flop 30 (FF2) properly scaled by its input resistor 2R to one-fourth a quantum level, shown in FIG. 11, will be summed with the analog input signal, shown in FIG. 9, in various combinations, shown in FIG. 12, depending on whether the flip-flops are set or reset. When only the flip-flop 28 (FF1) is set, the signal added to the analog input signal will be equivalent to one-half of the threshold level of the A-D converter. This is shown as level e of FIG. 12. When only the second flip-flop 30 (FF2) is set, the signal added to the analog input signal will be equivalent to one-quarter of the threshold level of the A-D converter. This is shown as level f of FIG. 12. When both the flip-flop 28 (FF1) and the second flip-flop 30 (FF2) are set, the signal added to the analog input signal will be equivalent to three-quarters of the threshold level of the A-D converter. This is shown as level g of FIG. 12. When neither of the flip-flops are set, nothing will be added to the analog input signal. This is shown as level *h* of FIG. 12.

The output of the level change circuit 32 will be applied to the A-D converter 24. As with the system shown in FIG. 7, the flip-flops are controlled by the word sync pulse of the A-D converter 24 so that the frequencies of the flip-flop outputs will be synchronized with the conversion period of the A-D converter 24 to avoid a step change in the analog input to the A-D converter during a conversion. The least significant bit of the A-D converter output will vary depending on which, if any, of the levels of the A-D converter input are crossing a threshold. The A-D converter 24 sends the digital representations of the analog input in a serial manner to the D-A converter 26. The D-A converter 11 convert the digital representations of the analog input to an analog signal under control of the word sync pulse.

Figure 13:
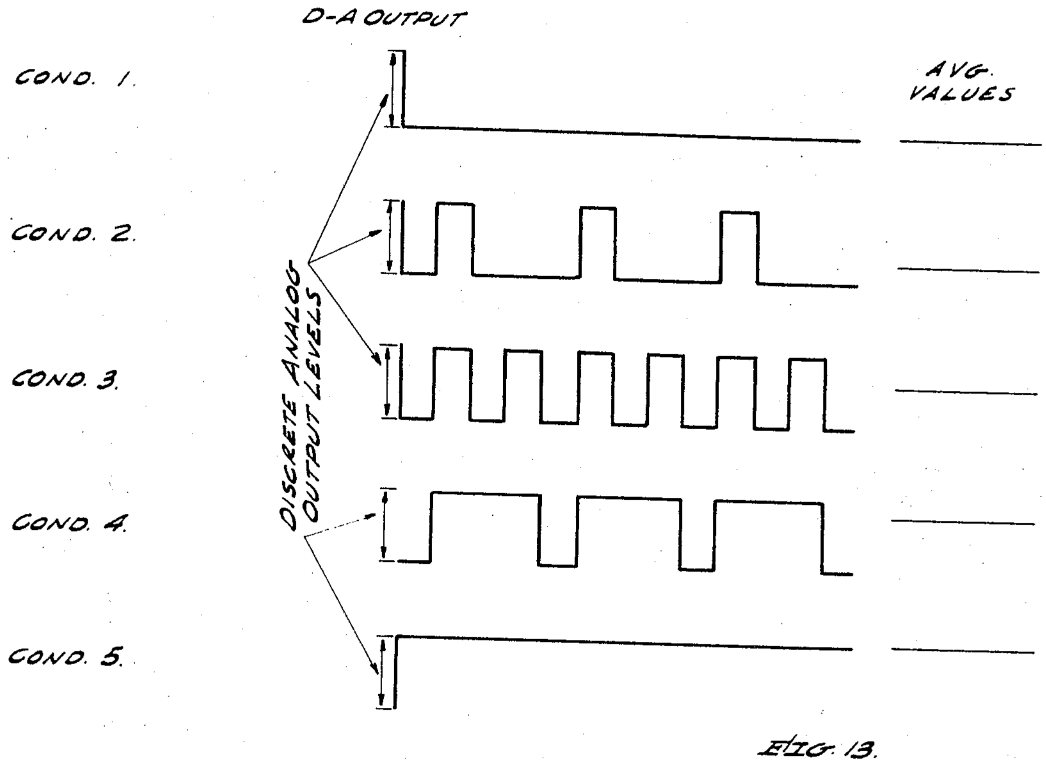

The output of the D-A converter 26 will take various forms depending on which, if any, of the levels of the input to the A-D converter 24 are crossing a threshold. The possible conditions for any two adjacent discrete analog output levels are shown in FIG. 13. Condition 1 shows the D-A converter output when the A-D converter input is always above the lower of the two thresholds and always below the next higher threshold. Condition 2 shows the D-A converter output when only the three-fourth level, level *g* of FIG. 12, of the A-D converter input is crossing the higher of the two thresholds. Condition 3 shows the D-A converter output when the three-fourth level and one-half level, levels *g* and *e* of FIG. 12, of the A-D converter input are crossing the higher of the two thresholds. Condition 4 shows the D-A converter output when the three-fourth level, one-half level, and one-fourth level, levels *g*, *e* and *f* of FIG. 12, of the A-D converter input are crossing the higher of the two thresholds. Condition 5 shows the D-A converter output when the A-D converter input is always above the higher of the two thresholds. When the D-A converter output is filtered by the filter 20, each of the conditions shown in FIG. 13 will provide an average value indicative of the analog input signal value between the two discrete analog output levels. Condition 2 will have an average value one-fourth above the lower discrete analog output level. Condition 3 will have an average value halfway between the discrete analog output levels. Condition 4 will have an average value three-fourth above the lower discrete analog output level.

While the invention has been described as a complete analog-to-digital-to-analog system, it will be apparent to those skilled in the art that the digital-to-analog portion of the system may be deleted and the digital information may be sent to a digital processor. For example, the digital processor may then analyze the fluctuations of the digital representation to obtain the additional resolution.

What is claimed is:

1. A system for converting an analog input signal to a digital representation of *n* bits where n is an integer, transmitting the digital representation and converting it to an analog output signal, said system having a resolution of $\frac{1}{2}^{n+1}$, said system comprising:

means for adding a square wave signal having a peak-to-peak voltage equal to one-half the equivalent analog voltage of the least significant bit of the digital representation to said analog input signal to obtain a resultant analog signal, means for converting the resultant analog signal to a digital representation, means for converting the digital representation to an analog signal containing a square wave component, and means for averaging said square wave component of the analog signal to provide said analog output signal.

2. A system for converting an analog input signal to a digital representation of *n* bits where *n* in an integer, transmitting the digital representation and converting it to an analog output signal, said system having a resolution of $\frac{1}{2}^{n+1}$, said system comprising:

analog-to-digital converter means for providing an output which is a digital representation of an analog signal applied to its input, said analog-to-digital converter means having threshold levels equal to the equivalent analog voltage of the least significant bit of the output signal, circuit means for adding a square wave signal having a peak-to-peak voltage equal to one-half the equivalent analog voltage of the least significant bit of the output signal of said analog-to-digital converter means to said analog input signal to obtain a resultant signal, means for coupling the resultant signal of said circuit means to the input of said analog-to-digital converter means, digital-to-analog converter means coupled to receive the output of said analog-to-digital converter means for providing an analog signal containing a square wave component, and averaging means coupled to receive the analog signal of said digital-to-analog converter means for averaging said square wave component of the received signal to provide said analog output signal.

3. The system claimed in claim 2 wherein said circuit means includes:

a free running multivibrator, and a summing amplifier.

4. The system claimed in claim 2 wherein said averaging means includes a low pass filter.

5. A system for converting an analog input signal to a digital representation of *n* bits where *n* is an integer, transmitting the digital representation and converting it to an analog output signal, said system having a resolution of $\frac{1}{2}^{n+1}$, said system comprising:

analog-to-digital converter means for providing an output which is a digital representation of an analog signal applied to its input, said analog-to-digital converter means having threshold levels equal to the equivalent analog voltage of the least significant bit of the output signal, signal generator means for generating a square wave signal output having a peak-to-peak voltage equal to one-half the equivalent analog voltage of the least significant bit of the output signal of said analog-to-digital converter means, signal combining means coupled to receive said analog input signal and the square wave signal output of said signal generator means for providing an output signal which is the sum of the received signals, means for coupling the output signal of said signal combining means to the input of said analog-to-digital converter means, digital-to-analog converter means coupled to receive the output of said analog-to-digital converter means for providing an analog signal containing a square wave component, and averaging means coupled to receive the analog signal of said digital-to-analog converter means for averaging said square wave component of the received signal to provide said analog output signal.

6. The system claimed in claim 5 wherein:

said signal generator means includes a free running multivibrator, said signal combining means includes a summing amplifier, and said averaging means includes a low pass filter.

7. A system for converting an analog input signal to a digital representation of *n* bits where *n* is an integer, transmitting the digital representation and converting it to an analog output signal, said system having a resolution of $\frac{1}{2}^{n+1}$, said system comprising:

analog-to-digital converter means for providing an output which is a digital representation of an analog signal applied to its input, said analog-to-digital converter means having threshold levels equal to the equivalent analog voltage of the least significant bit of the output signal, control means for providing a control signal when the digital representation of said analog-to-digital converter means is available at its output, circuit means having two stable states coupled to receive the control signal of said control means for providing an output signal which changes state in response to the received signal, signal conditioning means coupled to receive the output signal of said circuit means for providing an adjusted peak-todpeak voltage of said circuit means output signal equal to one-half the equivalent analog voltage of the least significant bit of the output signal of said analog-to-digital converter means, signal combining means coupled to receive said analog input signal and the adjusted peak-to-peak voltage of said signal conditioning means for providing an output signal which is the sum of the received signals, means for coupling the output signal of said signal combining means to the input of said analog-to-digital converter means, digital-to-analog converter means coupled to receive the output of said analog-to-digital converter means and the control signal of said control means for providing an analog signal containing a square wave component, and averaging means coupled to receive the analog signal of said digital-to-analog converter for averaging said square wave component of the received signal to provide said analog output signal.

8. The system claimed in claim 7 wherein:

said signal combining means includes a summing amplifier, and said averaging means includes a low pass filter.

9. A system for converting an analog input signal to a digital representation of *n* bits where *n* is an integer, transmitting the digital representation and converting it to an analog output signal, said system having a resolution of $\frac{1}{2}^{n+m}$ where m is an integer, said system comprising:

analog-to-digital converter means for providing an output which is a digital representation of an analog signal applied to its input, said analog-to-digital converter means having threshold levels equal to the equivalent analog voltage of the least significant bit of the output signal, control means for providing a control signal when the digital representation of said analog-to-digital converter means is available at its output, binary counter means having m stages coupled to receive the control signal of said control means for counting one count each time a control signal is received and for providing an output signal from each stage indicative of the state of that stage, signal conditioning means coupled to receive the output signals from each stage of said binary counter means for providing an adjusted output signal for the first stage of said binary counter means, the adjusted output signal having a peak-to-peak voltage equal to one-half the equivalent analog voltage of the least significant bit of the output signal of said analog-to-digital converter, and for providing an adjusted output signal for each succeeding stage of said binary counter means, the adjusted output signal for each succeeding stage having a peak-to-peak voltage equal to one-half the adjusted output signal of the preceding stage, signal combining means coupled to receive said analog input signal and the adjusted output signals of said signal conditioning means for providing an output signal which is the sum of the received signals, means for coupling the output signal of said signal combining means to the input of said analog-to-digital converter means, digital-to-analog converter means coupled to receive the output of said analog-to-digital converter means and the control signal of said control means for providing an analog signal containing a square wave component, and means coupled to receive the analog signal of said digital-to-analog converter for averaging said square wave component of the received signal to provide said analog output signal.

10. The system claimed in claim 9 wherein:

said signal combining means includes a summing amplifier, and said averaging means includes a low pass filter.

11. A system for converting an analog input signal to a digital representation of *n* bits where *n* is an integer, transmitting the digital representation and converting it to an analog output signal, said system having a resolution of $\frac{1}{2}^{n+m}$ where m is an integer, said system comprising:

counter means having m stages for providing an output signal from each stage indicative of the state of that stage, signal conditioning means coupled to receive the output signals from each stage of said counter means for providing an adjusted output signal for the first stage of said counter means, the adjusted output signal having a peak-to-peak voltage equal to one-half the equivalent analog voltage of the least significant bit of the digital representation, and for providing an adjusted output signal for each succeeding stage of said counter means, the adjusted output signal for each succeeding stage having a peak-to-peak voltage equal to one-half the adjusted output signal of the preceding stage, means for combining said analog input signal and the adjusted output signals of said signal conditioning means to obtain a resultant analog signal which is the sum of the received signals, means for converting the resultant analog signal to a digital representation, means for converting the digital representation to an analog signal containing a square wave component, and means for averaging said square wave component of the analog signal to provide said analog output signal.

* * * * *

PO-1050
(5/69)

UNITED STATES PATENT OFFICE
CERTIFICATE OF CORRECTION

Patent No. 3,656,152 Dated April 11, 1972

Inventor(s) James L. Gundersen

It is certified that error appears in the above-identified patent and that said Letters Patent are hereby corrected as shown below:

Col 3, line 73 "VA" should be --$V_A$--.

Col 4, line 40 after "22," insert --the A-D converter 24, the D-A converter 26, the filter 20,--.

Col 5, line 65 "in" should be --is--.

Col 7, line 3 "peak-todpeak" should be --peak-to-peak--.

Signed and sealed this 1st day of May 1973.

(SEAL)
Attest:

EDWARD M. FLETCHER, JR.
Attesting Officer

ROBERT GOTTSCHALK
Commissioner of Patents